(12) United States Patent
Tajima et al.

(10) Patent No.: US 9,136,425 B2
(45) Date of Patent: Sep. 15, 2015

(54) SEMICONDUCTOR LIGHT EMITTING ELEMENT AND LIGHT EMITTING DEVICE

(71) Applicant: Kabushiki Kaisha Toshiba, Minato-ku (JP)

(72) Inventors: Jumpei Tajima, Koganei (JP); Shigeya Kimura, Yokohama (JP); Hiroshi Ono, Setagaya-ku (JP); Naoharu Sugiyama, Komatsu (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/337,899

(22) Filed: Jul. 22, 2014

(65) Prior Publication Data

US 2015/0034997 A1    Feb. 5, 2015

(30) Foreign Application Priority Data

Jul. 30, 2013   (JP) .................................. 2013-157359

(51) Int. Cl.
*H01L 33/00* (2010.01)
*H01L 33/32* (2010.01)
*H01L 33/40* (2010.01)
*H01L 33/06* (2010.01)
*H01L 33/64* (2010.01)

(52) U.S. Cl.
CPC ............ *H01L 33/0025* (2013.01); *H01L 33/06* (2013.01); *H01L 33/32* (2013.01); *H01L 33/405* (2013.01); *H01L 33/64* (2013.01)

(58) Field of Classification Search
CPC ..... H01L 33/0025; H01L 33/06; H01L 33/32; H01L 33/405; H01L 33/64; H01L 2224/48091; H01L 2924/00014; H01L 2224/73265; H01L 33/20; H01L 33/38; H01L 33/62

USPC ................ 257/99, 13, 43, 28, 98, 88, 79, 773
See application file for complete search history.

(56) References Cited

U.S. PATENT DOCUMENTS

| 8,822,249 B2 * | 9/2014 | Paek et al. ........................ 438/46 |
| 2005/0140015 A1 * | 6/2005 | Shionoiri et al. ............. 257/773 |
| 2006/0091409 A1 | 5/2006 | Epler et al. |
| 2006/0240585 A1 | 10/2006 | Epler et al. |

(Continued)

FOREIGN PATENT DOCUMENTS

| JP | 2006-128710 | 5/2006 |
| JP | 2008-53406 | 3/2008 |

(Continued)

*Primary Examiner* — Mohammed Shamsuzzaman

(74) *Attorney, Agent, or Firm* — Oblon, McClelland, Maier & Neustadt, L.L.P.

(57) ABSTRACT

A semiconductor light emitting element includes a first substrate, a stacked body, an electrode, and a conductive layer. The first substrate has a first face and a first side face. The first side face intersects the first face. The first substrate includes a plurality of conductive portions and a plurality of insulating portions arranged alternately. The stacked body is aligned with the first substrate. The stacked body includes first and second semiconductor layers and a light emitting layer. The electrode is electrically connected to the first semiconductor layer. The conductive layer is electrically connected to at least one of the conductive portions and the second semiconductor layer. At least one of the insulating portions is disposed between the first side face and a portion of the conductive layer nearest to the first side face.

8 Claims, 9 Drawing Sheets

(56) References Cited

U.S. PATENT DOCUMENTS

| | | |
|---|---|---|
| 2008/0012028 A1* | 1/2008 | Yoon et al. .................... 257/79 |
| 2010/0041170 A1 | 2/2010 | Epler et al. |
| 2011/0012164 A1* | 1/2011 | Kim ............................. 257/99 |
| 2011/0073900 A1* | 3/2011 | Sugizaki ....................... 257/99 |
| 2011/0084301 A1 | 4/2011 | Epler et al. |
| 2011/0220932 A1 | 9/2011 | Katsuno et al. |
| 2011/0220955 A1* | 9/2011 | Park ............................. 257/99 |
| 2013/0049036 A1 | 2/2013 | Jeong |
| 2013/0133825 A1* | 5/2013 | Hattori et al. .............. 156/272.2 |
| 2013/0313562 A1 | 11/2013 | Epler et al. |
| 2014/0175498 A1* | 6/2014 | Lai ............................... 257/99 |

FOREIGN PATENT DOCUMENTS

| | | |
|---|---|---|
| JP | 2011-187873 | 9/2011 |
| JP | 2012-114120 | 6/2012 |
| JP | 2012-253318 | 12/2012 |

\* cited by examiner

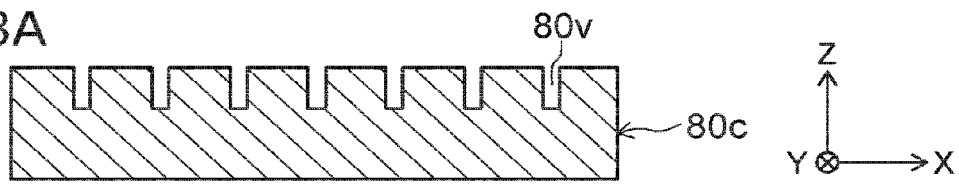
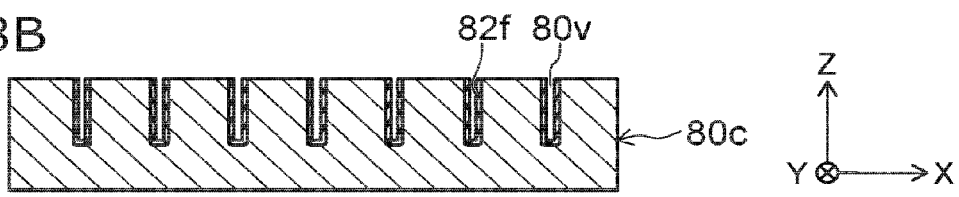
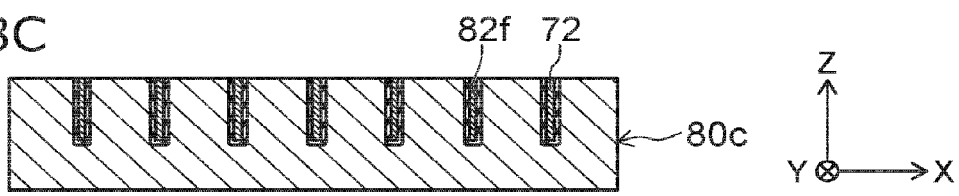
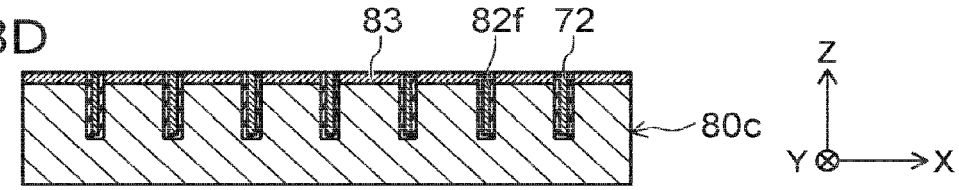
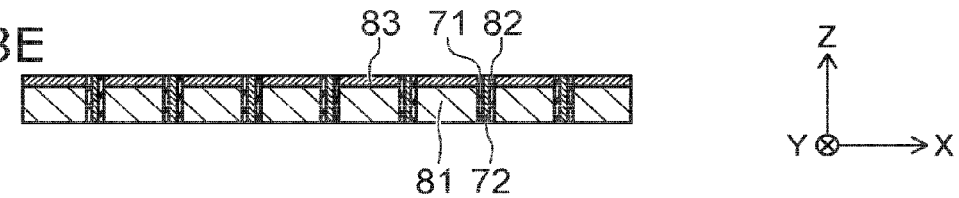
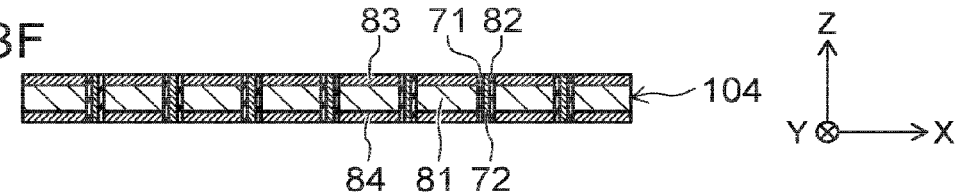

SEMICONDUCTOR LIGHT EMITTING ELEMENT AND LIGHT EMITTING DEVICE

CROSS-REFERENCE TO RELATED APPLICATIONS

This application is based upon and claims the benefit of priority from Japanese Patent Application No. 2013-157359, filed on Jul. 30, 2013; the entire contents of which are incorporated herein by reference.

FIELD

Embodiments described herein relate generally to a semiconductor light emitting element and a light emitting device.

BACKGROUND

There are semiconductor light emitting elements such as light emitting diodes, laser diodes, and the like. There are light emitting devices using semiconductor light emitting elements. For both semiconductor light emitting elements and light emitting devices, it is desirable to increase the light extraction efficiency.

BRIEF DESCRIPTION OF THE DRAWINGS

FIGS. 8A to 8F are cross-sectional views schematically illustrating the process of manufacturing a different support substrate according to the first embodiment;

DETAILED DESCRIPTION

Figure 1A:
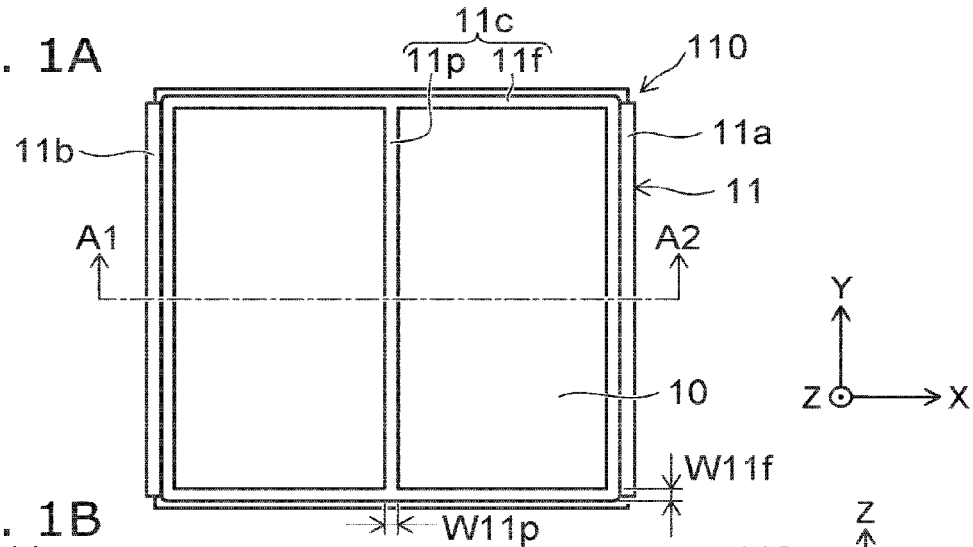
FIGS. 1A to 1C are schematic views illustrating a semiconductor light emitting element according to a first embodiment.

According to one embodiment, a semiconductor light emitting element includes a first substrate, a stacked body, an electrode, and a conductive layer. The first substrate has a first face and a first side face. The first face is parallel to a first direction and a second direction perpendicular to the first direction. The first side face intersects the first direction and extends in the second direction. The first substrate includes a plurality of conductive portions and a plurality of insulating portions arranged alternately in the first direction. Each of the conductive portions and each of the insulating portions extend in the second direction. The stacked body is aligned with the first substrate in a third direction intersecting with the first direction and the second direction. The stacked body includes a first semiconductor layer, a second semiconductor layer, and a light emitting layer. The first semiconductor layer has a second side face intersecting the first direction. The first semiconductor layer is of a first conductivity type. The second semiconductor layer is provided between the first semiconductor layer and the first face. The second semiconductor layer is of a second conductivity type. The light emitting layer is provided between the first semiconductor layer and the second semiconductor layer. The electrode is electrically connected to the first semiconductor layer. The electrode covers at least a portion of the second side face. The conductive layer is provided between the second semiconductor layer and the first substrate. The conductive layer is electrically connected to at least one of the conductive portions and the second semiconductor layer. At least one of the insulating portions is disposed between the first side face and a portion of the conductive layer nearest to the first side face.

According to another embodiment, a semiconductor light emitting element includes a first substrate, a stacked body, an electrode, and a conductive layer. The first substrate has a first face and a first side face. The first face is parallel to a first direction and a second direction perpendicular to the first direction. The first side face intersects the first direction and extends in the second direction. The first substrate includes a plurality of conductive portions and a plurality of insulating portions arranged alternately in the first direction. Each of the conductive portions and each of the insulating portions extend in the second direction. The stacked body is aligned with the first substrate in a third direction intersecting with the first direction and the second direction. The stacked body includes a first semiconductor layer, a second semiconductor layer, and a light emitting layer. The first semiconductor layer includes a first portion and a second portion aligned with the first portion in the first direction. The first semiconductor layer is of a first conductivity type. The second semiconductor layer is provided between the first portion and the first face. The second semiconductor layer is of a second conductivity type. The light emitting layer is provided between the first semiconductor layer and the second semiconductor layer. The electrode is provided between the second portion and the first substrate. The electrode is electrically connected to the first semiconductor layer. The conductive layer is provided between the second semiconductor layer and the first substrate. The conductive layer is electrically connected to at least one of the conductive portions and the second semiconductor layer. At least one of the insulating portions is disposed between the first side face and a portion of the conductive layer nearest to the first side face.

According to another embodiment, a light emitting device includes a semiconductor light emitting element and a second substrate. The semiconductor light emitting element includes a first substrate, a stacked body, an electrode, and a conductive layer. The first substrate has a first face and a first side face. The first face is parallel to a first direction and a second direction perpendicular to the first direction. The first side face intersects the first direction and extends in the second direction. The first substrate includes a plurality of conductive portions and a plurality of insulating portions arranged alternately in the first direction. Each of the conductive portions and each of the insulating portions extend in the second direction. The stacked body is aligned with the first substrate in a third direction intersecting with the first direction and the second direction. The stacked body includes a first semiconductor layer, a second semiconductor layer, and a light emitting layer. The first semiconductor layer has a second side face intersecting the first direction. The first semiconductor layer is of a first conductivity type. The second semiconductor layer is provided between the first semiconductor layer and the first face. The second semiconductor layer is of a second conductivity type. The light emitting layer is provided between the first semiconductor layer and the second semiconductor layer. The electrode is electrically connected to the first semiconductor layer. The electrode covers at least a portion of the second side face. The conductive layer is provided between the second semiconductor layer and the first substrate. The conductive layer is electrically connected to at least one of the conductive portions and the second semiconductor layer. At least one of the insulating portions is disposed between the first side face and a portion of the conductive layer nearest to the first side face. The second substrate includes a first electrode pad and a second electrode pad. The first electrode pad is electrically connected to the electrode. The second electrode pad is electrically connected to the conductive layer.

According to another embodiment, a light emitting device includes a semiconductor light emitting element and a second substrate. The semiconductor light emitting element includes a first substrate, a stacked body, an electrode, and a conductive layer. The first substrate has a first face and a first side face. The first face is parallel to a first direction and a second direction perpendicular to the first direction. The first side face intersects the first direction and extends in the second direction. The first substrate includes a plurality of conductive portions and a plurality of insulating portions arranged alternately in the first direction. Each of the conductive portions and each of the insulating portions extend in the second direction. The stacked body is aligned with the first substrate in a third direction intersecting with the first direction and the second direction. The stacked body includes a first semiconductor layer, a second semiconductor layer, and a light emitting layer. The first semiconductor layer includes a first portion and a second portion aligned with the first portion in the first direction. The first semiconductor layer is of a first conductivity type. The second semiconductor layer is provided between the first portion and the first face. The second semiconductor layer is of a second conductivity type. The light emitting layer is provided between the first semiconductor layer and the second semiconductor layer. The electrode is provided between the second portion and the first substrate. The electrode is electrically connected to the first semiconductor layer. The conductive layer is provided between the second semiconductor layer and the first substrate. The conductive layer is electrically connected to at least one of the conductive portions and the second semiconductor layer. At least one of the insulating portions is disposed between the first side face and a portion of the conductive layer nearest to the first side face. The second substrate includes a first electrode pad and a second electrode pad. The first electrode pad is electrically connected to the electrode. The second electrode pad is electrically connected to the conductive layer.

Various Embodiments are described hereinafter while referring to the drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1B:
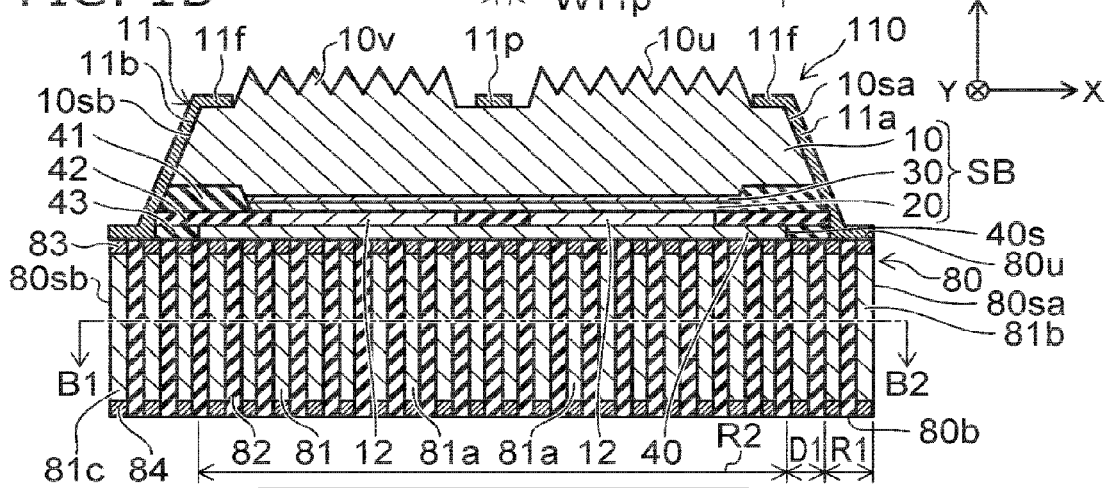
Figure 1C:
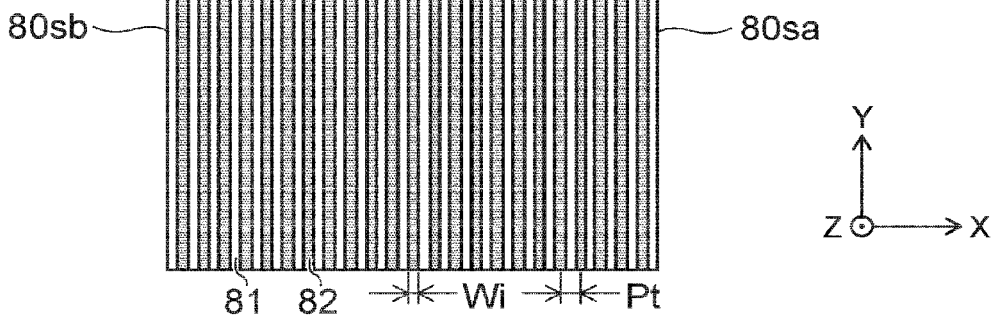

FIGS. 1A to 1C are schematic views illustrating a semiconductor light emitting element according to a first embodiment.

FIG. 1A is a schematic plan view. FIG. 1B is a schematic cross-sectional view taken across line A1-A2 of FIG. 1A. FIG. 1C is a partial cross-sectional view schematically illustrating the cross-section across line B1-B2 in FIG. 1B. FIG. 1B is illustrated enlarged compared with FIGS. 1A and 1C.

As illustrated in FIGS. 1A to 1C, a semiconductor light emitting element 110 according to this embodiment includes a support substrate 80 (first substrate), a stacked body SB, a first electrode 11 (electrode), and a second electrode 12.

The support substrate 80 includes a top face 80u (first face) and a side face 80sa (first side face). The side face 80sa intersects a first direction parallel to the top face 80u, and extends in a second direction perpendicular to the first direction and is parallel to the top face 80u. In this example, the support substrate 80 is rectangular. The side face 80sa is, for example, one of the four side faces of the rectangular support substrate 80. The shape of the support substrate 80 is not limited to a rectangle, but may be any shape.

Here, one direction that is parallel to the top face 80u is the X-axis direction. The Y-axis direction is parallel to the top face 80u and perpendicular the X-axis direction. The Z-axis direction is perpendicular to the X-axis direction and the Y-axis direction. The Z-axis direction is, for example, the direction perpendicular to the top face 80u. In this example, the X-axis direction is the first direction, the Y-axis direction is the second direction, and the Z-axis direction is a third direction. In this example, the side face 80sa extends in the Y-axis direction and extends in the Z-axis direction. In other words, the side face 80sa extends in a direction substantially perpendicular to the top face 80u.

In the Specification of this application, "extends in a direction" includes cases in which there is a portion that extends in that direction, as well as cases strictly extending in that direction. For example, the side face 80sa may include at least a portion extending in the Y-axis direction.

The support substrate 80 further includes a side face 80sb. The side face 80sb is the side face on the side opposite to the side face 80sa. The side face 80sb is, for example, opposite the side face 80sa in the X-axis direction. The side face 80sb, for example, intersects the X-axis direction and extends in the Y-axis direction. The side face 80sb also extends in the Z-axis direction, for example. In this example, the side face 80sb is substantially parallel to the side face 80sa. The side face 80sb may also be not parallel to the side face 80sa.

The support substrate 80 includes a plurality of conductive portions 81 and a plurality of insulating portions 82. The plurality of conductive portions 81 and the plurality of insulating portions 82 are disposed alternately in the X-axis direction. In this example, the plurality of conductive portions 81 and the plurality of insulating portions 82 are disposed alternately over the whole X-axis direction of the support substrate 80 (top face 80u). The width Wi in the X-axis direction of each of the insulating portions 82 is, for example, not less than 1 µm and not more than 10 µm. The spacing Pt of the plurality of insulating portions 82 is, for example, not less than 2 µm and not more than 30 µm. The spacing Pt is, for example, the distance between centers of each of the plurality of insulating portions 82 in the X-axis direction. More specifically, it is the distance in the X-axis direction between the center in the X-axis direction of one of a pair of adjacent insulating portion 82 and the center in the X-axis direction of the other insulating portion 82. The width Wi and the spacing Pt are, for example, substantially the same in each of the plurality of insulating portions 82. In other words, each of the plurality of insulating portions 82 is, for example, disposed as equal spacing in the X-axis direction. The width Wi and the spacing Pt may, for example, be different in each of the plurality of insulating portions 82.

The plurality of conductive portions 81 and the plurality of insulating portions 82 extend in the Y-axis direction. In this example, the plurality of conductive portions 81 and the plurality of insulating portions 82 also extend in the Z-axis direction. In this example, each of the plurality of conductive portions 81 and the plurality of insulating portions 82 are substantially parallel to the side face 80sa. Each of the plurality of conductive portions 81 and the plurality of insulating portions 82 may be not be parallel to the side face 80sa.

The electrical conductivity of the insulating portions 82 is lower than the electrical conductivity of the conductive portions 81. The insulating portions 82 are portions with lower electrical conductivity that the conductive portions 81 on the support substrate 80. Each of the plurality of insulating portions 82 electrically insulates the corresponding conductive portions 81 of the plurality of conductive portions 81. The insulating portions 82 are, for example, provided between two adjacent conductive portions 81, electrically insulating each of the two adjacent conductive portions 81.

For example, silicon is used in the conductive portions 81. A metal material such as, for example, aluminum or copper or the like may be used in the conductive portions 81. For example, a silicon oxide film, a silicon nitride film, or a silicon oxynitride film or the like can be used in the insulating portions 82. For example, a resin material or the like may be used in the insulating portions 82.

One end in the Z-axis direction of each of the plurality of insulating portions 82 reaches the top face 80u. A portion of the top face 80u is formed by one end of each of the plurality of insulating portions 82. The other end in the Z-axis direction of each of the plurality of insulating portions 82 reaches a bottom face 80b of the support substrate 80. A portion of the bottom face 80b is formed by the other end of each of the plurality of insulating portions 82. The bottom face 80b is the face on the side opposite the top face 80u of the support substrate 80. The bottom face 80b is, for example, substantially parallel to the top face 80u.

In this example, the support substrate 80 further includes a plurality of first metal portions 83 and a plurality of second metal portions 84. The plurality of first metal portions 83 and the plurality of second metal portions 84 are provided if necessary and can be omitted.

Each of the plurality of first metal portions 83 is provided at one end in the Z-axis direction of one of the plurality of conductive portions 81. Each of the plurality of first metal portions 83 is provided at the end on the top face 80u side of one of the plurality of conductive portions 81. In other words, each of the plurality of first metal portions 83 is provided on one of the plurality of conductive portions 81. For example, the electrical conductivity of the first metal portions 83 is higher than the electrical conductivity of the conductive portions 81. For example, an AuSn alloy or an NiSn alloy may be used in the first metal portions 83. In this example, a portion of the top face 80u is formed by one end of each of the plurality of first metal portions 83. In this example, the top face 80u is formed by the plurality of insulating portions 82 and the plurality of first metal portions 83. For example, the top face 80u may be formed by the plurality of conductive portions 81 and the plurality of insulating portions 82.

Each of the plurality of second metal portions 84 is provided at the other end in the Z-axis direction of one of the plurality of conductive portions 81. Each of the plurality of second metal portions 84 is provided at the end on the bottom face 80b side of one of the plurality of conductive portions 81. In other words, each of the plurality of second metal portions 84 is provided below one of the plurality of conductive portions 81. For example, the electrical conductivity of the second metal portions 84 is higher than the electrical conductivity of the conductive portions 81. For example, Al, Ag, their alloys, and the like can be used in the second metal portion 84. In this example, a portion of the bottom face 80b is formed by one end of each of the plurality of second metal portions 84. In this example, the bottom face 80b is formed by the plurality of insulating portions 82 and the plurality of second metal portions 84. For example, the bottom face 80b may be formed by the plurality of conductive portions 81 and the plurality of insulating portions 82.

In this example, the side face 80sa and the side face 80sb are formed by a conductive portion 81, a first metal portion 83, and a second metal portion 84. The side face 80sa and the side face 80sb may be formed by, for example, an insulating portion 82. For example, if the conductive portions 81 and the insulating portions 82 are not parallel to the side face 80sa and the side face 80sb, the side face 80sa and the side face 80sb may be formed by both a conductive portion 81 and an insulating portion 82.

The stacked body SB is aligned with the support substrate 80 in the Z-axis direction. The stacked body SB is provided on the top face 80u. The stacked body SB includes a first semiconductor layer 10, a second semiconductor layer 20, and a light emitting layer 30. The maximum length (width) in the X-axis direction of the stacked body SB is shorter than the maximum length in the X-axis direction of the top face 80u. In this example, the shape of the stacked body SB when projected onto the X-Y plane and the shape of the top face 80u (support substrate 80) when projected onto the X-Y plane are each rectangles. The width of the top face 80u in the X-axis direction is, for example, 500 µm (not less than 400 µm and not more than 600 µm). The width of the top face 80u in the Y-axis direction is, for example, 500 µm (not less than 400 µm and not more than 600 µm). The width of the stacked body SB in the X-axis direction is, for example, 400 µm (not less than 300 µm and not more than 500 µm). The width of the stacked body SB in the Y-axis direction is, for example, 400 µm (not less than 300 µm and not more than 500 µm). Also, the thickness of the support substrate 80 (thickness in the Z-axis direction) is, for example, 100 µm (not less than 50 µm and not more than 200 µm). The thickness of the stacked body SB is, for example, 2 µm (not less than 1 µm and not more than 10 µm).

The first semiconductor layer 10 has a first conductivity type and includes nitride semiconductor. For example, the first conductivity type is n-type and the second conductivity type is p-type. The first conductivity type may be p-type and the second conductivity type may be n-type. Hereafter, a case in which the first conductivity type is n-type, and the second conductivity type is p-type will be described. A GaN layer doped with n-type impurities is used, for example, as the first semiconductor layer 10. Si is used, for example, as the n-type impurity.

The first semiconductor layer 10 has a side face 10sa (second side face) that intersects with the X-axis direction. The side face 10sa extends, for example, in the Y-axis direction. The side face 10sa is, for example, one of the four side faces of the rectangular first semiconductor layer 10. The side face 10sa for example faces in the same direction as the side face 80sa of the support substrate 80.

The first semiconductor layer 10 further includes a side face 10sb. The side face 10sb is the side face on the side opposite to the side face 10sa. The side face 10sb is, for example, opposite the side face 10sa in the X-axis direction. The side face 10sb, for example, intersects the X-axis direction and extends in the Y-axis direction.

In this example, the side face 10sa and the side face 10sb are inclined with respect to the top face 80u (X-Y plane). The width in the X-axis direction of the first semiconductor layer 10 reduces from the support substrate 80 towards the stacked body SB. In other words, the width in the X-axis direction of the first semiconductor layer 10 reduces towards the upward direction. The side face 10sa and the side face 10sb are tapered faces. The angle formed between the side face 10sa and the top face 80u, and the angle formed between the side face 10sb and the top face 80u is, for example, 60° (not less than 40° and not more than 80°). The side face 10sa and the side face 10sb may be, for example, substantially perpendicular to the top face 80u. In this example, the side face 10sa is not parallel to the side face 10sb. The side face 10sb may be, for example, substantially parallel to the side face 10sa.

The first semiconductor layer 10 further includes a top face 10u (second face). The top face 10u is, for example, a face on the side opposite to the light emitting layer 30 of the first semiconductor layer 10. The top face 10u is, for example, a face that faces in substantially the same direction as the top face 80u. Irregularities 10v are provided on the top face 10u. The top face 10u is, for example, a roughened surface.

The second semiconductor layer 20 is provided between the first semiconductor layer 10 and the top face 80u. The second semiconductor layer 20 is a second conductivity type and includes nitride semiconductor. A GaN layer doped with p-type impurities is used, for example, as the second semiconductor layer 20. Mg is used, for example, as the p-type impurity. The thickness of the second semiconductor layer 20 is, for example, smaller than the thickness of the first semiconductor layer 10. The thickness of the second semiconductor layer 20 may be, for example, not less than the thickness of the first semiconductor layer 10.

The light emitting layer 30 is provided between the first semiconductor layer 10 and the second semiconductor layer 20. The Z-axis direction corresponds, for example, to the stacking direction of the first semiconductor layer 10, the second semiconductor layer 20, and the light emitting layer 30.

The light emitting layer 30 includes a nitride semiconductor, for example. The light emitting layer 30 includes, for example, a plurality of barrier layers, and well layers provided between each of the plurality of barrier layers. The barrier layers and the well layers are stacked along the Z-axis direction. The light emitting layer 30 uses, for example, a multi-quantum well (MQW) structure. The light emitting layer 30 may use, for example, a single-quantum well (SQW) structure. A GaN layer, for example, is used for the barrier layer. An InGaN layer may be used as the well layer, for example.

When a voltage is applied between the first semiconductor layer 10 and the second semiconductor layer 20, a current flows through the light emitting layer 30. In this way light is emitted from the light emitting layer 30.

In the semiconductor light emitting element 110, the top face 10u of the first semiconductor layer 10 becomes a light extraction face. As stated previously, irregularities 10v are provided on the top face 10u. In this way it is possible to reduce total reflection at the top face 10u of the light emitted from the light emitting layer 30 and improve the light extraction efficiency.

The first electrode 11 covers at least a portion of the side face 10sa of the first semiconductor layer 10. The first electrode 11 may cover, for example, the whole side face 10sa. The first electrode 11 is electrically connected to the first semiconductor layer 10. The first electrode 11 is electrically connected to the first semiconductor layer 10 by, for example, contact with the side face 10sa. The first electrode 11 has reflectivity with respect to the light emitted from the light emitting layer 30. The reflectance of the first electrode 11 is, for example, higher than the reflectance of the first semiconductor layer 10. Al or an Al alloy or the like is used in the first electrode 11.

The first electrode 11 includes, for example, a first side face portion 11a (first extending part), a second side face portion 11b, and a top face portion 11c (second extending part). The first side face portion 11a covers at least a portion of the side face 10sa of the first semiconductor layer 10. The second side face portion 11b covers at least a portion of the side face 10sb of the first semiconductor layer 10. The top face portion 11c covers at least a portion of the top face 10u of the first semiconductor layer 10. The first side face portion 11a may cover the whole side face 10sa. The second side face portion 11b may cover the whole side face 10sb. In this way, in this example, the first electrode 11 further covers at least a portion of the side face 10sb and a portion of the top face 10u.

The first side face portion 11a, the second side face portion 11b, and the top face portion 11c are electrically connected to each other. The top face portion 11c contacts, for example, the first side face portion 11a and the second side face portion 11b. In this way, the first side face portion 11a, the second side face portion 11b, and the top face portion 11c are electrically connected to each other. For example, the first side face portion 11a, the second side face portion 11b, and the top face portion 11c are continuous with each other. For example, the first side face portion 11a, the second side face portion 11b, and the top face portion 11c are formed integrally.

The top face portion 11c has a narrow linear shape extending in any direction parallel to the top face 10u (the X-Y plane). The width of the top face portion 11c in a direction perpendicular to the extension direction is, for example, not less than 1 μm and not more than 20 μm. The area of the top face portion 11c as a percentage of the area of the top face 10u is, for example, not less than 1% and not more than 30%.

The top face portion 11c includes, for example, a casing part 11f along the outer edge of the top face 10u, and a partitioning part 11p that partitions the region on the inside of the casing part 11f. In this example, the shape of the casing part 11f when projected onto the X-Y plane is rectangular. The width W11f of the casing part 11f in a direction perpendicular to the extension direction is, for example, not less than 1 μm and not more than 20 μm.

The partitioning part 11p is disposed, for example, near the center in the X-axis direction of the top face 10u. The partitioning part 11p extends, for example, in a linear manner in the Y-axis direction. The width Whip of the partitioning part 11p in a direction perpendicular to the extension direction is, for example, not less than 1 μm and not more than 20 μm. The position and the shape of the partitioning part 11p may be selected as desired. The partitioning part 11p may, for example, partition the region inside the casing part 11f into a lattice form. In other words, the partitioning part 11p may partition the region inside the casing part 11f into not fewer than two regions. A plurality of partitioning parts 11p, for example, may be provided.

The second electrode 12 is provided between the second semiconductor layer 20 and the top face 80u. In this example, two second electrodes 12 are arranged in the X-axis direction. The number of second electrodes 12 is not limited to two, it may be one or it may be three or more. Each of the two second electrodes 12 is electrically connected to at least one of the plurality of conductive portions 81 and the second semiconductor layer 20. Each of the two second electrodes 12 is, for example, in contact with the second semiconductor layer 20. In this way, each of the two second electrodes 12 is electrically connected to the second semiconductor layer 20.

Each of the two second electrodes 12 is electrically insulated from the side face 80sa by at least one insulating portion 82 disposed between at least one conductive portion 81 that is electrically connected to a second electrode 12 and the side face 80sa of the support substrate 80. Also, in this example, each of the two second electrodes 12 is electrically insulated from the side face 80sb by at least one insulating portion 82 disposed between at least one conductive portion 81 that is electrically connected to a second electrode 12 and the side face 80sb of the support substrate 80.

In this way, at least one of the plurality of conductive portions 81 is electrically connected to a second electrode 12. In other words, at least one of the plurality of conductive portions 81 is electrically connected to the second semiconductor layer 20 via the second electrode 12.

The second electrode 12 has, for example, reflectivity with respect to the light emitted from the light emitting layer 30. The reflectance of the second electrode 12 is, for example, higher than the reflectance of the second semiconductor layer 20. An Ag or Ag alloy or the like is used in the second electrode 12, for example. In this way, for example, it is possible to obtain high reflectivity in the second electrode 12.

Also, in this example, at least one of the plurality of conductive portions 81 that is not electrically connected to the second electrode 12 is electrically connected to the first electrode 11. In other words, at least another one of the plurality of conductive portions 81 is electrically connected to the first semiconductor layer 10 via the first electrode 11. For example, at least one of the plurality of conductive portions 81 is electrically connected to the first side face portion 11a, and at least one of the plurality of conductive portions 81 is electrically connected to the second side face portion 11b.

In this example, the width in the X-axis direction of the support substrate 80 (top face 80u) is greater than the width in the X-axis direction of the stacked body SB, and the first electrode 11 extends on the top face 80u. For example, the first side face portion 11a and the second side face portion 11b contact the top face 80u. For example, the first side face portion 11a contacts a first metal portion 83, and the second side face portion 11b contacts a different first metal portion 83. In this way, the first side face portion 11a is electrically connected to a conductive portion 81, and the second side face portion 11b is electrically connected to a different conductive portion 81. Each of the plurality of conductive portions 81 need not necessarily be connected to the first semiconductor layer 10.

In the following, a conductive portion 81 electrically connected to the second electrode 12 is referred to as a first conductive portion 81a. A conductive portion 81 electrically connected to the first side face portion 11a is referred to as a second conductive portion 81b. A conductive portion 81 electrically connected to the second side face portion 11b is referred to as a third conductive portion 81c.

The semiconductor light emitting element 110 further includes, for example, a metal layer 40 (conductive layer), a first insulating layer 41, a second insulating layer 42, and a third insulating layer 43.

The metal layer 40 is provided between the two second electrodes 12 and the support substrate 80. The metal layer 40 is electrically connected to the second electrode 12 and at least one of the plurality of conductive portions 81. The metal layer 40 is, for example, in contact with each of the two second electrodes 12. In this way the metal layer 40 is electrically connected to each of the two second electrodes 12. Also, the metal layer 40 is in contact with, for example, the top face 80u. In this way the metal layer 40 is electrically connected to at least one of the plurality of conductive portions 81. In other words, the portion of the conductive portions 81 in contact with the metal layer 40 and the first metal portions 83 is a first conductive portion 81a. The metal layer 40 increases the contact between the second electrode 12 and the first metal portions 83, for example. The first metal portions 83 increase the contact between the metal layer 40 and the conductive portions 81, for example.

The metal layer 40 is electrically insulated from the side face 80sa by at least one insulating portion 82 disposed between the first conductive portion 81a and the side face 80sa of the support substrate 80. Also, in this example, the metal layer 40 is electrically insulated from the side face 80sb by at least one insulating portion 82 disposed between the first conductive portion 81a and the side face 80sb of the support substrate 80.

At least one insulating portion 82 is disposed between the side face 80sa and the portion of the metal layer 40 closest to the side face 80sa, when projected onto a plane parallel with the top face 80u (the X-Y plane). In this way, the metal layer 40 is electrically insulated from the side face 80sa. The metal layer 40 includes a side face 40s that extends in the Y-axis direction. The side face 40s is oriented in substantially the same direction as the side face 80sa, for example. The side face 40s is substantially parallel to the side face 80sa, for example. In this example, the side face 40s is the portion of the metal layer 40 closest to the side face 80sa. In other words, at least one insulating portion 82 is disposed between the side face 80sa and the side face 40s, when projected onto the X-Y plane. For example, if the side face 40s and the side face 80sa intersect, the portion with the shortest distance between the side face 40s and the side face 80sa is the portion closest to the side face 80sa.

For example, at least any of Ti, W, Pt, Au, Cu, Ni, Ag, Co, Sn, Pd, and Al can be used in the metal layer 40. For example, an alloy that includes at least any of Ti, W, Pt, Au, Cu, Ni, Ag, Co, Sn, Pd, and Al can be used in the metal layer 40. For example, a metal with high reflectance such as Ag and the like can be used in the metal layer 40. In this way, it is possible to, for example, promote reflection of light, and increase the light extraction efficiency. The metal layer 40 may have a single layer structure made from a single metal material, or it may have a multi-layer structure made from not fewer than two metal materials, for example. The metal layer 40 may be omitted, and the second electrode 12 made to contact the top face 80u, for example. In this case, the second electrode 12 becomes a conductive layer.

The first insulating layer 41 is provided between the first electrode 11 and the second semiconductor layer 20, and between the first electrode 11 and the light emitting layer 30. The first insulating layer 41 electrically insulates the first electrode 11 and the second semiconductor layer 20. The first insulating layer 41 electrically insulates the first electrode 11 and the light emitting layer 30.

The second insulating layer 42 is provided between the first electrode 11 and the second electrode 12. In this example, the second insulating layer 42 is provided between the first electrode 11 and each of the two second electrodes 12. The second insulating layer 42 insulates the first electrode 11 and the second electrode 12.

The third insulating layer 43 is provided between the first electrode 11 and the metal layer 40. The third insulating layer 43 electrically insulates the first electrode 11 and the metal layer 40. For example, at least any of a silicon oxide film, a silicon nitride film, and a silicon oxynitride film can be used in the first insulating layer 41, the second insulating layer 42, and the third insulating layer 43.

Figure 2:
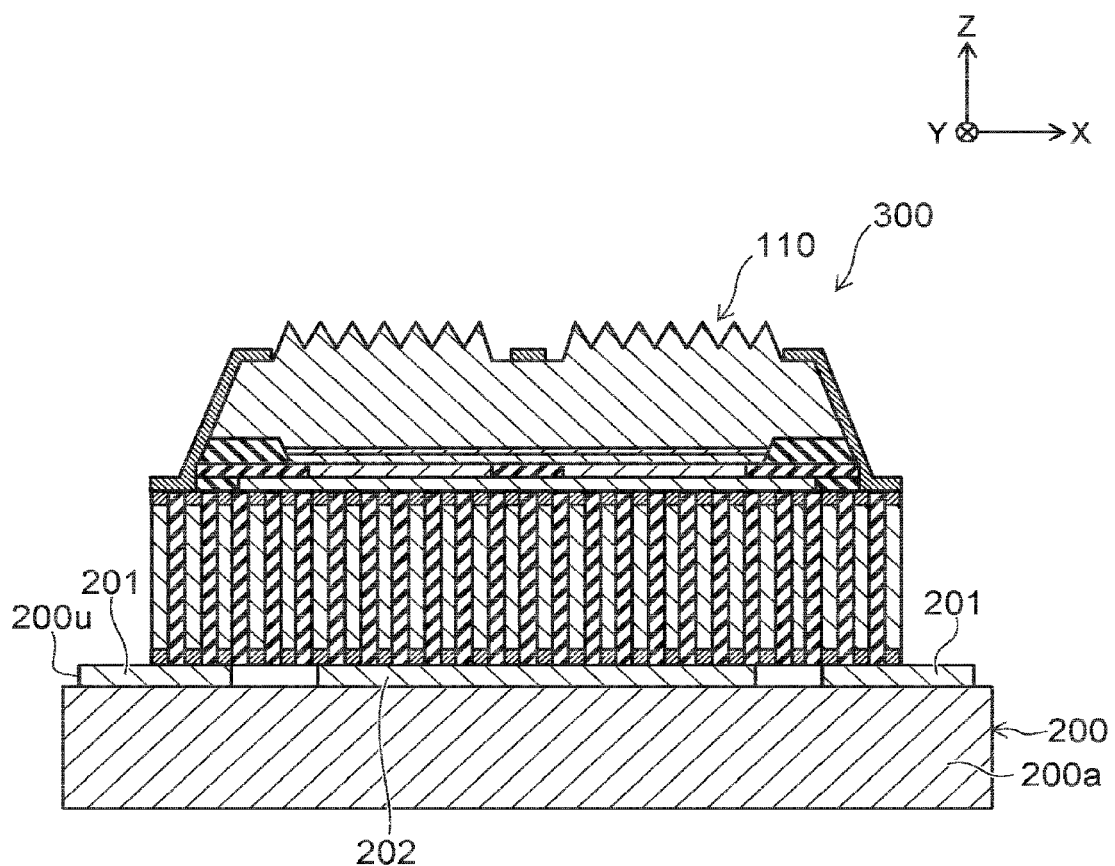
FIG. 2 is a schematic cross-sectional view illustrating a light emitting device according to the first embodiment.

FIG. 2 is a schematic cross-sectional view illustrating a light emitting device according to the first embodiment.

FIG. 2 is a schematic cross-sectional view illustrating a light emitting device 300 using the semiconductor light emitting element 110 as described above.

As illustrated in FIG. 2, the light emitting device 300 includes the semiconductor light emitting element 110 and a mounting substrate 200 (second substrate).

The mounting substrate 200 supports the semiconductor light emitting element 110. The semiconductor light emitting element 110 is provided on the mounting substrate 200. The mounting substrate 200 includes, for example, a main body part 200a, a pair of first electrode pads 201, and a second electrode pad 202.

The main body part 200a is, for example, a rectangular shaped plate. The main body part 200a includes a top face 200u. The top face 200u is opposite the bottom face 80b of the support substrate 80. The width in the X-axis direction of the top face 200u is wider than the width in the X-axis direction of the bottom face 80b. The width in the Y-axis direction of the top face 200u is wider than the width in the Y-axis direction of the bottom face 80b. For example a ceramic or AlN or the like can be used in the main body part 200a.

The pair of first electrode pads 201 and the second electrode pad 202 are provided on the top face 200u. One of the first electrode pads 201 is disposed in a position opposite the second conductive portion 81b. The other of the first electrode pads 201 is disposed in a position opposite the third conductive portion 81c. The second electrode pad 202 is disposed in a position opposite the first conductive portion 81a. For example, by mounting the semiconductor light emitting element 110 on the top face 200u, the pair of first electrode pads 201 and the second electrode pad 202 contact the opposing second metal portion 84.

In this way, one of the first electrode pads 201 is electrically connected to the second conductive portion 81b. The other of the first electrode pads 201 is electrically connected to the third conductive portion 81c. The second electrode pad 202 is electrically connected to the first conductive portion 81a. In other words, each of the first electrode pads 201 is electrically connected to the first electrode 11 via the second conductive portion 81b and the third conductive portion 81c. The second electrode pad 202 is electrically connected to the second electrode 12 via the first conductive portion 81a. Each of the first electrode pads 201 is electrically connected to the first semiconductor layer 10, and the second electrode pad 202 is electrically connected to the second semiconductor layer 20. The plurality of second metal portions 84 increases the contact between each pad 201, 202 and the conductive portions 81, for example.

The mounting substrate 200 includes, for example, a wiring pattern. The semiconductor light emitting element 110 is electrically connected to the wiring pattern of the mounting substrate 200 via each of the pads 201, 202, for example. In more detail, the first semiconductor layer 10 and the second semiconductor layer 20 of the semiconductor light emitting element 110 are electrically connected to the wiring pattern of the mounting substrate 200.

In semiconductor light emitting elements, an electrode pad is provided on the top face of the first semiconductor layer, and the electrode pad of the mounting substrate and the electrode pad of the first semiconductor layer are connected using bonding wire. The area of the electrode pad is comparatively large compared with the area of the first semiconductor layer. Therefore, in semiconductor light emitting elements of this type, the light emitted from the light emitting layer is reflected at the electrode pad, and the light extraction efficiency is reduced. Also, the light emitting area (the area of the portion of the top face of the first semiconductor layer on which the first electrode is not provided) is small. For example, if the size of the top face of the first semiconductor layer is 400 μm square, and the size of the electrode pad is 100 μm square, the light emitting area is reduced by about 6.3%. If the light emitting area is reduced then, for example, the current density is increased. For example, the luminous efficiency is reduced.

In contrast, in the semiconductor light emitting element 110 according to this embodiment and the light emitting device 300 using this semiconductor light emitting element 110, the electrode pad is not provided on the first semiconductor layer 10, and the first electrode 11 and the first electrode pad 201, and the second electrode 12 and the second electrode pad 202 can be electrically connected via, for example, the conductive portions 81. Therefore, in the semiconductor light emitting element 110 according to this embodiment and the light emitting device 300 using this semiconductor light emitting element 110, it is possible to minimize the reduction in the light extraction efficiency. It is possible to obtain a high light extraction efficiency. In addition, in the semiconductor light emitting element 110 and the light emitting device 300 using the semiconductor light emitting element 110, it is possible to minimize the reduction in light emitting area, for example. For example, it is possible to reduce the current density and minimize the reduction in luminous efficiency.

FIGS. 3A to 3G are cross-sectional views schematically illustrating the process of manufacturing a support substrate according to the first embodiment.

Figure 3A:
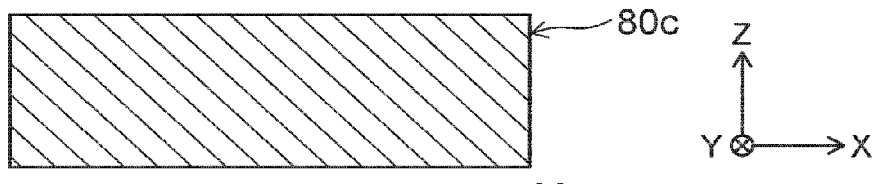
FIGS. 3A to 3G are cross-sectional views schematically illustrating the process of manufacturing a support substrate according to the first embodiment.

As illustrated in FIG. 3A, in the manufacture of the support substrate 80, first a conductive substrate 80c that includes the material that will form the conductive portions 81 is prepared. The conductive substrate 80c is, for example, a silicon substrate, a metal substrate, or the like. The thickness of the conductive substrate 80c (the thickness in the Z-axis direction) is greater than the thickness of the support substrate 80.

Figure 3B:
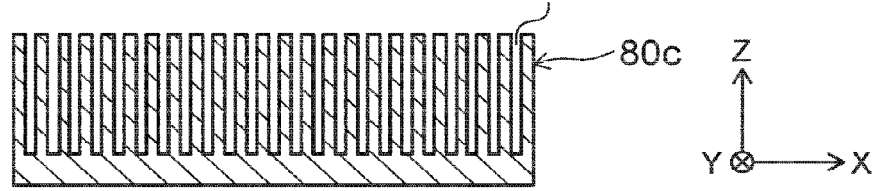

As illustrated in FIG. 3B, a plurality of grooves 80v is formed in the conductive substrate 80c by, for example, a photolithography process and an etching process. The shape of each groove 80v is in accordance with the shape of each insulating portion 82. In this example, each groove 80v extends in the Y-axis direction and the Z-axis direction, and the grooves 80v are arranged in the X-axis direction. The width in the X-axis direction of each groove 80v and the spacing of each groove 80v are substantially the same as those of each insulating portion 82.

Figure 3C:
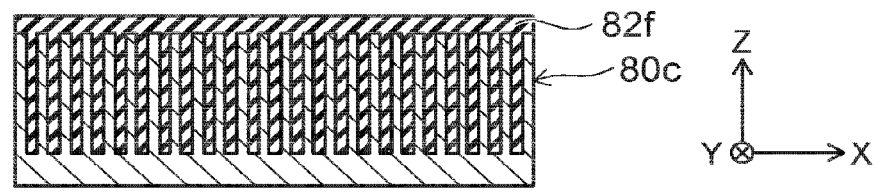

As illustrated in FIG. 3C, insulating material is applied onto the conductive substrate 80c by, for example, spin on glass (SOG), and by filling each groove 80v with the insulating material, an insulating film 82f is formed on the conductive substrate 80c. The material of the insulating film 82f is substantially the same as the material of each insulating portion 82. The material of the insulating film 82f can be, for example, a liquid in which $SiO_2$ is dissolved in a solvent or the like.

Figure 3D:
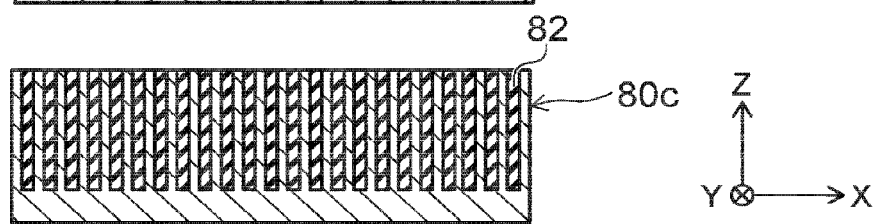

As illustrated in FIG. 3D, the insulating film 82f is ground using, for example, a grinding process. In this way, each of the insulating portions 82 is formed from the insulating film 82f.

Figure 3E:
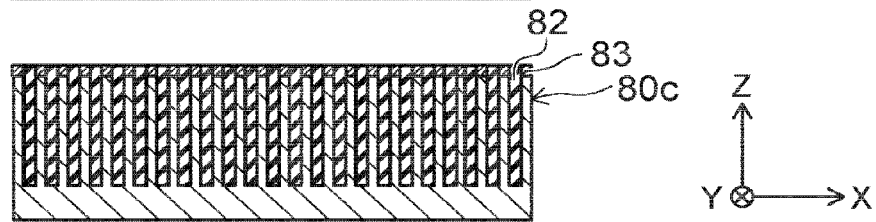

As illustrated in FIG. 3E, each first metal portion 83 is formed on a portion that will constitute each conductive portion 81 of the conductive substrate 80c, by for example, a photolithography process, an etching process, and a film forming process, or the like. Then, a separately formed stacked body SB or the like is bonded on each insulating portion 82 and each first metal portion 83.

Figure 3F:
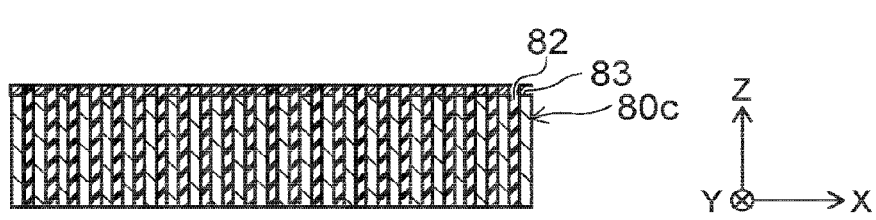

As illustrated in FIG. 3F, after bonding the stacked body SB or the like, the conductive substrate 80c is ground from the reverse face side, and the ends of each insulating portion 82 are exposed. Grinding from the reverse face side may be carried out, for example, before bonding the stacked body SB or the like.

Figure 3G:
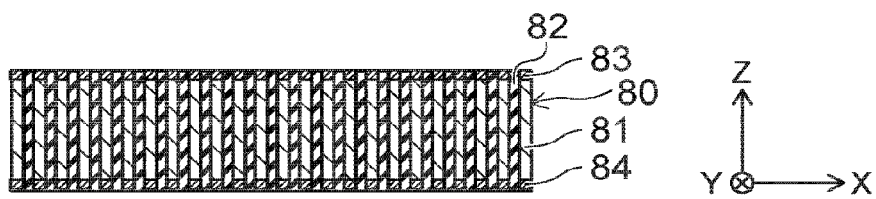

As illustrated in FIG. 3G, each conductive portion 81 is formed from the conductive substrate 80c, and each second metal portion 84 is formed on the bottom of each conductive portion 81, by for example, a photolithography process, an etching process, and a film making process, or the like.

As a result of the above the support substrate 80 is completed.

The top face 80u of the support substrate 80 includes a first region R1 that is electrically connected to the first semiconductor layer 10, and a second region R2 that is electrically connected to the second semiconductor layer 20 (see FIG. 1). The spacing Pt of each of the plurality of insulating portions 82 is, for example, not more than the distance D1 in the X-axis direction between the first region R1 and the second region R2. More specifically, the first region R1 is the region on the top face 80u opposite the conductive member that is electrically connected to the first semiconductor layer 10. More specifically, the second region R2 is the region on the top face 80u opposite the conductive member that is electrically connected to the second semiconductor layer 20. The distance D1 is the minimum distance in the X-axis direction between the first region R1 and the second region R2.

In this way, at least one insulating portion 82 is disposed between the first region R1 and the second region R2. Therefore, for example, it is possible to reliably insulate the first electrode 11 and the second electrode 12. Also, for example, when bonding the stacked body SB and the support substrate 80, it is not necessary to position the stacked body SB and the support substrate 80 in the X-axis direction. For example, it is possible to simplify the manufacture of the semiconductor light emitting element 110.

More specifically, the distance D1 is the minimum distance in the x-axis direction between the first region R1 and the second region R2. In this example, the distance D1 is substantially the same as the distance in the X axis direction between the first electrode 11 and the metal layer 40, for example.

The distance D1 is, for example, not less than 2 µm and not more than 30 µm (for example 20 µm). Therefore, the spacing Pt is not less than 2 µm and not more than 30 µm. In this way it is possible to satisfy the above.

If the top face 80u is not electrically connected to the first electrode 11, the spacing Pt of each of the plurality of insulating portions 82 is, for example, not more than the distance in the X-axis direction between the side face 80sa and the second region R2. In this way, at least one insulating portion 82 is disposed between the side face 80sa and the second region R2.

Also, preferably the total of the areas of each of the insulating portions 82 is not more than 20% of the area of the support substrate 80. In this way, for example, it is possible to obtain good electrical conductivity and heat dissipation.

For example, assume that in a support substrate 80 of 500 µm square, the spacing Pt is 30 µm and the width Wi is 5 µm. In this way, it is possible to make the area of the insulating portions 82 about 16% of the area of the support substrate 80. For example, the width Wi in the X-axis direction of the insulating portions 82 is not less than 1 µm and not more than 10 µm. In this way it is possible to obtain good electrical conductivity and heat dissipation, for example.

Figure 4:
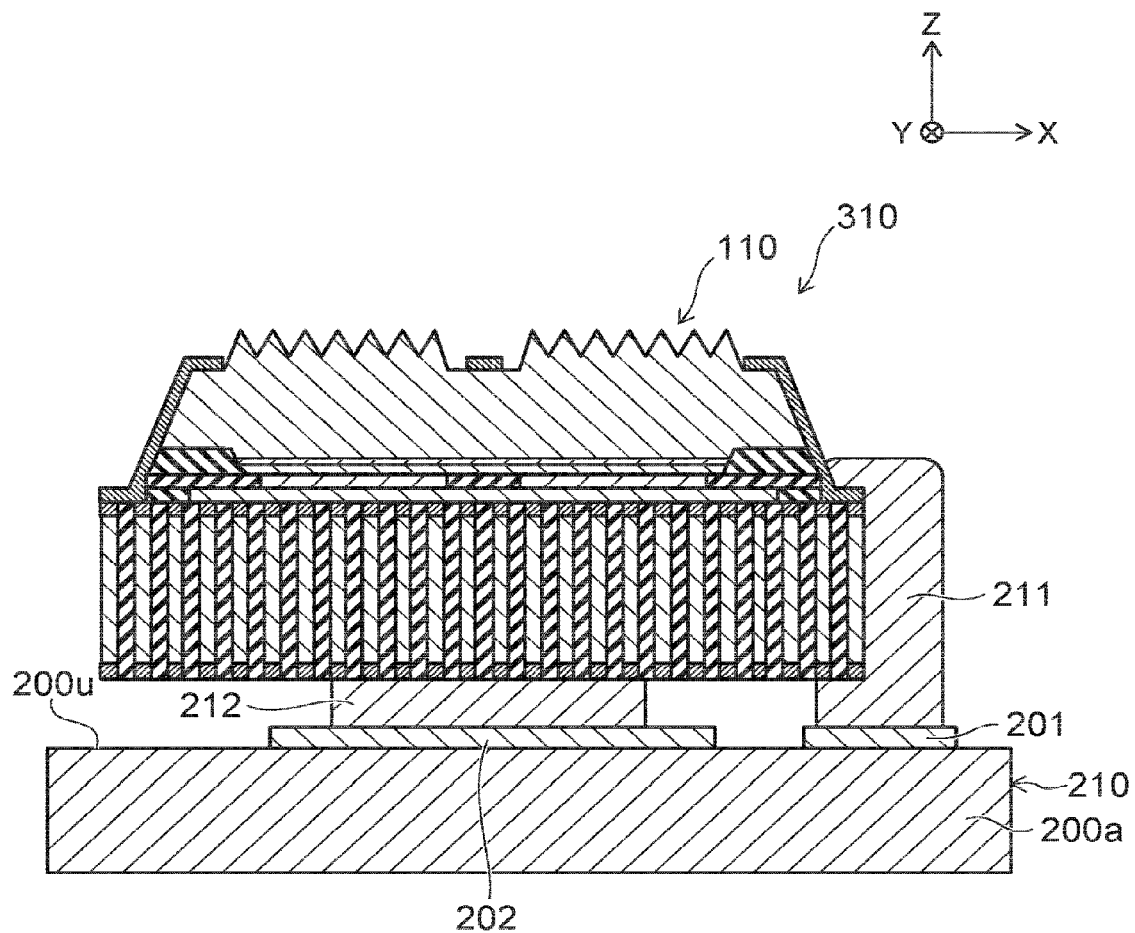
FIG. 4 is a schematic cross-sectional view illustrating another light emitting device according to the first embodiment.

FIG. 4 is a schematic cross-sectional view illustrating another light emitting device according to the first embodiment.

As illustrated in FIG. 4, in a mounting substrate 210 of a light emitting device 310, there is one first electrode pad 201. Also, in the light emitting device 310, the first electrode 11 and the first electrode pad 201 are electrically connected by a first connection member 211, and the second electrode 12 and the second electrode pad 202 are electrically connected by a second connection member 212.

The second connection member 212 is electrically connected to the first conductive portion 81a and the second electrode pad 202. The first connection member 211 is electrically connected to the first electrode 11 and a first electrode pad 201. For example, the first connection member 211 is electrically connected to the first electrode 11 and the first electrode pad 201 by contact with the first electrode 11 and the first electrode pad 201. Also, the first connection member 211 extends along the side face 80sa of the support substrate 80. The first connection member 211 is, for example, in contact with the side face 80sa.

For example, solder or electrically conductive paste or the like is used in the first connection member 211 and the second connection member 212. In the semiconductor light emitting element 110, the second electrode 12 is electrically insulated from the side face 80sa by at least one insulating portion 82. Therefore, in the semiconductor light emitting element 110, it is possible to electrically connect the first electrode 11 and the first electrode pad 201 by the first connection member 211 contacting the side face 80sa, as in the light emitting device 310. In this way, when the first electrode 11 and the first electrode pad 201 are electrically connected by the first connection member 211, each of the plurality of conductive portions 81 does not have to be electrically connected to the first electrode 11. Therefore in the semiconductor light emitting element 110 of this embodiment, it is possible to electrically connect the first electrode 11 and the first electrode pad 201 with the first connection member 211, and electrically connect the second electrode 12 and the second electrode pad 202 with the second connection member 212, without providing an electrode pad in the first semiconductor layer 10. Therefore, it is possible to minimize the reduction in the light extraction efficiency in the light emitting device 310 using the semiconductor light emitting element 110. For example, it is possible to obtain high light extraction efficiency. For example, it is possible to minimize the reduction in light emission area.

Also, in this example, the width in the X-axis direction of the support substrate 80 (top face 80u) is greater than the width in the X-axis direction of the stacked body SB, and the first electrode 11 extends on the top face 80u. In this way, for example, it is possible to increase the contact area between the first electrode 11 and the first connection member 211. For example, it is possible to more appropriately electrically connect the first electrode 11 and the first connection member 211.

Figure 5A:
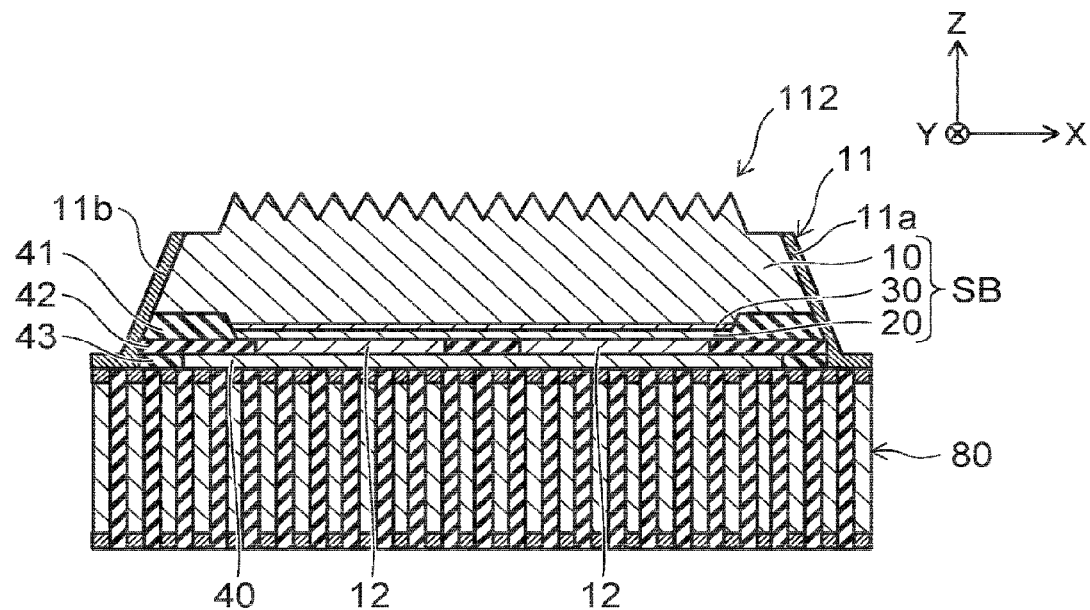
FIG. 5A and FIG. 5B are schematic cross-sectional views illustrating another semiconductor light emitting element according to the first embodiment.
Figure 5B:
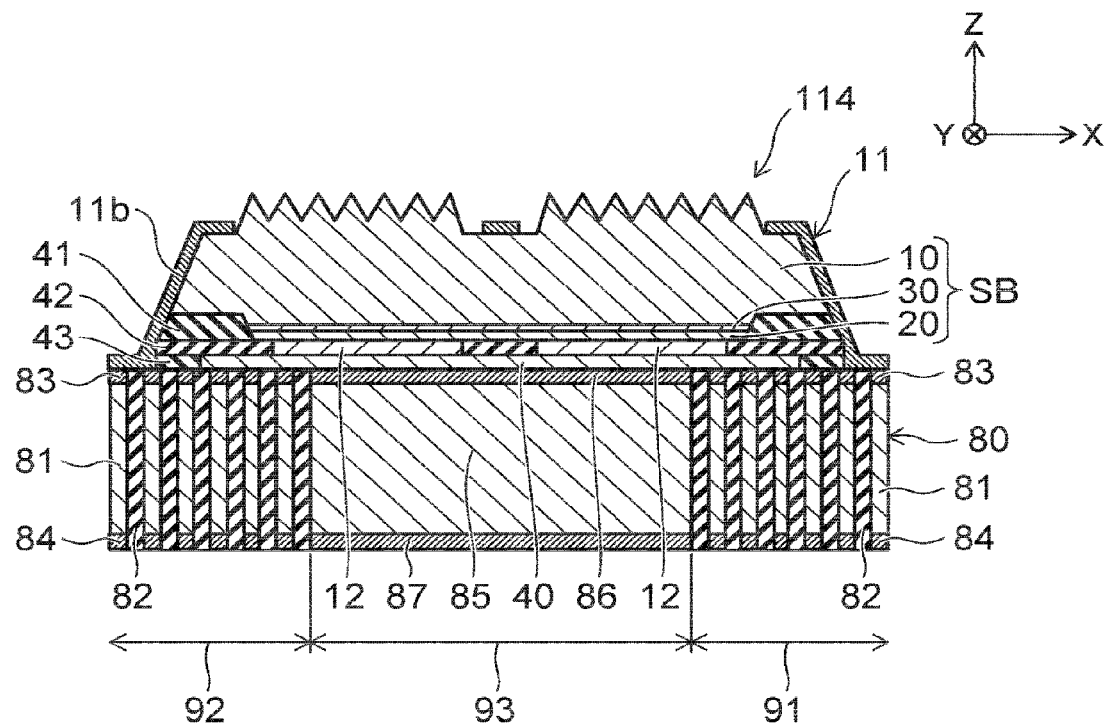

FIG. 5A and FIG. 5B are schematic cross-sectional views illustrating another semiconductor light emitting element according to the first embodiment.

As illustrated in FIG. 5A, in a semiconductor light emitting element 112, the first electrode 11 covers only the side faces 10sa, 10sb of the first semiconductor layer 10. In the semiconductor light emitting element 112, first electrode 11 does not cover the top face 10u of the first semiconductor layer 10. In this way, for example, it is possible to improve the light extraction efficiency.

In this example, the first electrode 11 includes the first side face portion 11a and the second side face portion 11b. In this way, the first electrode 11 does not necessarily have to cover the top face 10u of the first semiconductor layer 10. The first electrode 11 may cover at least the side face 10sa of the first semiconductor layer 10.

Also, in the semiconductor light emitting element 112, the second side face portion 11b is separated from the first side face portion 11a. In the semiconductor light emitting element 112, for example, the first side face portion 11a and the second side face portion 11b are electrically connected via the mounting substrate 200. In this way, a plurality of portions that are separated from each other is provided in the first electrode 11, and each portion may be electrically connected to each conductive portion 81.

As illustrated in FIG. 5B, in a semiconductor light emitting element 114, the support substrate 80 includes a first alternating portion 91, a second alternating portion 92, and an intermediate portion 93. In the first alternating portion 91, each of the plurality of conductive portions 81 and the plurality of insulating portions 82 are arranged alternately in the X-axis direction, the same as in the semiconductor light emitting element 110. The second alternating portion 92 is disposed separated from the first alternating portion 91 in the X-axis direction. In the second alternating portion 92 also, each of the plurality of conductive portions 81 and the plurality of insulating portions 82 are arranged alternately in the X-axis direction.

The intermediate portion 93 is disposed between the first alternating portion 91 and the second alternating portion 92. The intermediate portion 93 includes an intermediate conductive portion 85. The width in the X-axis direction of the intermediate conductive portion 85 is, for example, wider than the width in the X-axis direction of the conductive portion 81. Apart from the width in the X-axis direction, the intermediate conductive portion 85 is substantially the same as the conductive portion 81. In other words, the intermediate conductive portion 85 is a conductive portion 81 that has been widened in the X-axis direction. The intermediate conductive portion 85 is electrically connected to the second electrode 12. In this example, the second electrode 12 is electrically connected to at least one of the plurality of conductive portions 81, and electrically connected to the intermediate conductive portion 85.

In this way, the conductive portions 81 and the insulating portions 82 may be provided only near the side faces 80sa, 80sb of the support substrate 80, without providing them on the whole top face 80u in the X-axis direction.

The intermediate portion 93 may further include, for example, a third metal portion 86 and a fourth metal portion 87. The third metal portion 86 is disposed, for example, between the metal layer 40 and the intermediate conductive portion 85. The third metal portion 86, for example, increases the contact between the metal layer 40 and the intermediate conductive portion 85. The third metal portion 86 is, for example, substantially the same as the first metal portion 83, apart from the width in the X axis direction. The fourth metal portion 87 is disposed, for example, below the intermediate conductive portion 85. The fourth metal portion 87, for example, increases the contact between the intermediate conductive portion 85 and the second electrode pad 202.

In this way, when the intermediate portion 93 is provided on the support substrate 80, it is possible to, for example, increase the conductivity between the second electrode 12 and the second electrode pad 202 compared with the case in which the plurality of conductive portions 81 and the plurality of insulating portions 82 are arranged alternatively in the X-axis direction over the whole top face 80u. For example, it is possible to increase the heat dissipation. The width in the X-axis direction of the intermediate portion 93 (intermediate conductive portion 85) as a percentage of the width in the X-axis direction of the top face 80u is, for example, not less than 20% and not more than 80%. In this way, it is possible to obtain good electrical conductivity and heat dissipation while maintaining insulation between the first electrode 11 and the second electrode 12.

However, when the intermediate portion 93 is provided, for example, it is necessary to provide a support substrate 80 corresponding to the width of the intermediate portion 93, for each different width in the X-axis direction of the stacked body SB In contrast, when a plurality of conductive portions 81 and the plurality of insulating portions 82 are arranged alternately in the x-axis direction over the whole top face 80u, for example, it is possible to apply the support substrate 80 to a plurality of types of stacked body SB with different widths in the X-axis direction. For example, it is possible to more easily carry out positioning when bonding the support substrate 80 and stacked body SB. For example, it is possible to increase the productivity of the semiconductor light emitting element 110.

Figure 6A:
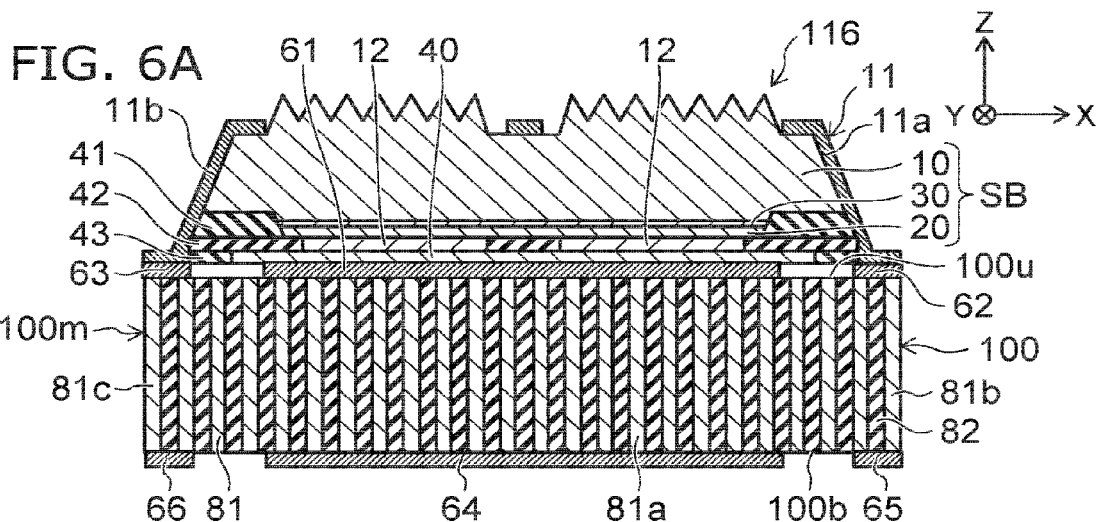
FIGS. 6A to 6C are schematic cross-sectional views illustrating another semiconductor light emitting element according to the first embodiment.
Figure 6B:
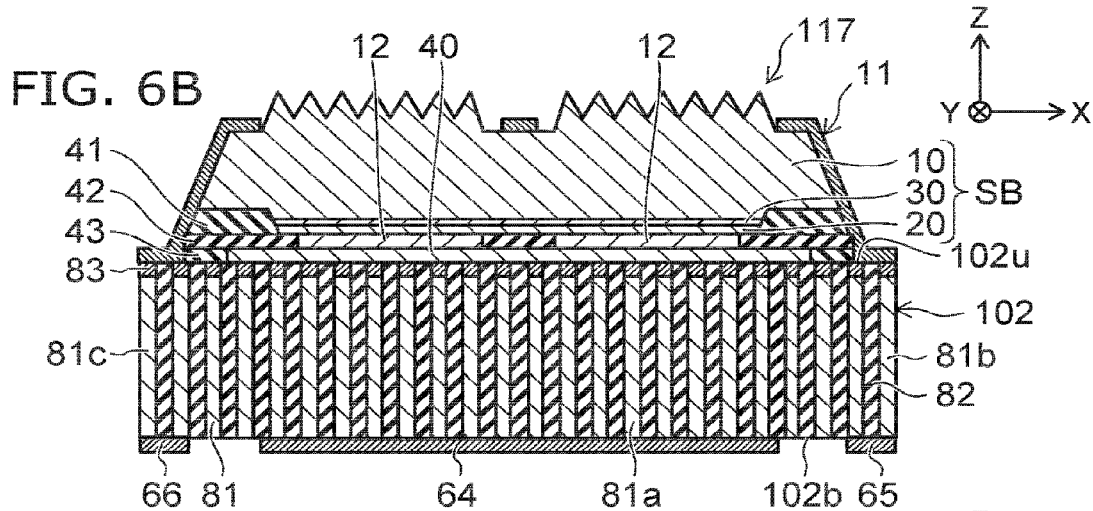
Figure 6C:
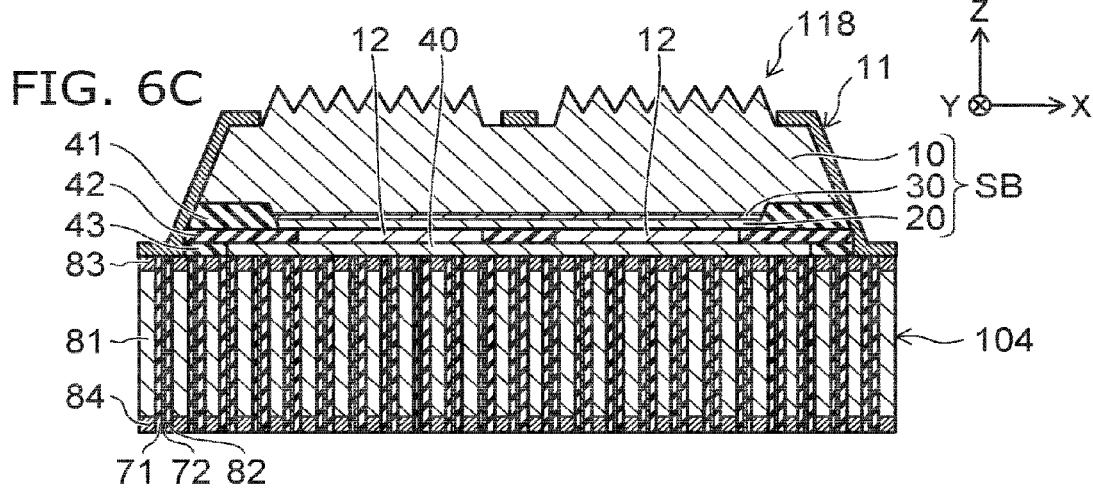

FIGS. 6A to 6C are schematic cross-sectional views illustrating another semiconductor light emitting element according to the first embodiment.

As illustrated in FIG. 6A, a support substrate 100 of a semiconductor light emitting element 116 includes a substrate main body 100m, and metal layers 61 to 66. In the support substrate 100, each of the first metal portions 83 and each of the second metal portions 84 are omitted, and instead the metal layers 61 to 66 are provided.

The substrate main body 100m includes the plurality of conductive portions 81 and the plurality of insulating portions 82 arranged alternately in the X-axis direction. In this example, a top face 100u (first face) and a bottom face 100b of the substrate main body 100m are formed by each of the conductive portions 81 and each of the insulating portions 82.

The metal layer 61 (first metal layer) is provided between the metal layer 40 and the substrate main body 100m. The metal layer 61 is electrically connected to the metal layer 40 and a portion of the plurality of conductive portions 81. In other words, the metal layer 61 is electrically connected to the first conductive portion 81a.

The metal layer 62 (second metal layer) is provided between the first side face portion 11a of the first electrode 11 and the substrate main body 100m. The metal layer 62 is electrically connected to the first side face portion 11a and a portion of the plurality of conductive portions 81. In other words, the metal layer 62 is electrically connected to the second conductive portion 81b.

The metal layer 63 is provided between the second side face portion 11b of the first electrode 11 and the substrate main body 100m. The metal layer 63 is electrically connected to the second side face portion 11b and a portion of the plurality of conductive portions 81. In other words, the metal layer 63 is electrically connected to the third conductive portion 81c.

The metal layers 64 to 66 are provided on the bottom face 100b. The metal layer 64 (third metal layer) is electrically connected to the first conductive portion 81a. The metal layer 65 (fourth metal layer) is separated from the metal layer 64, and is electrically connected to the second conductive portion 81b. The metal layer 66 is separated from the metal layer 64 and the metal layer 65, and is electrically connected to the third conductive portion 81c.

The electrical conductivity of each of the metal layers 61 to 66 is, for example, higher than the electrical conductivity of the conductive portions 81. The metal layers 61 to 66, for example, increase the contact between the substrate main body 100m and other conductive members. For example, the contact with the metal layer 40 or the contact between the substrate main body 100m and the first electrode 11 is increased. For example, an AuSn alloy or an NiSn alloy or the like can be used in the metal layers 61 to 66. The metal layers 61 to 66 are, for example, solder layers.

The metal layers 61 to 66 are formed by forming a metal film on the top face 100u or the bottom face 100b, after forming the substrate main body 100m with each of the conductive portions 81 and each of the insulating portions 82 arranged in stripe form, for example. Then, patterning of the metal films is carried out by a photolithography process and an etching process or the like. In this way, the metal layers 61 to 66 can be formed.

With the support substrate 100, manufacturer is easier compared with the support substrate 80. For example, it is possible to increase the productivity of the semiconductor light emitting element 116.

As illustrated in FIG. 6B, a support substrate 102 of a semiconductor light emitting element 117 includes the plurality of conductive portions 81, the plurality of insulating portions 82, the plurality of first metal portions 83 (metal portions), and the metal layers 64 to 66. In this way, each of the first metal portions 83 may be provided on a top face 102u side of the support substrate 102, and the metal layer 64 (first metal layer), the metal layer 65 (second metal layer), and the metal layer 66 may be provided on a bottom face 102b side. In the support substrate 102, for example, manufacture is easier compared with the support substrate 80. Also, in the support substrate 80, it is possible to increase the contact with the stacked body SB and the like compared with the support substrate 100.

As illustrated in FIG. 6C, a support substrate 104 of a semiconductor light emitting element 118 includes the plurality of conductive portions 81, the plurality of insulating portions 82, a plurality of intermediate insulating portions 71, and a plurality of intermediate conductive portions 72. Each of the plurality of intermediate insulating portions 71 are provided between the plurality of conductive portions 81 and the plurality of insulating portions 82. Each of the plurality of intermediate conductive portions 72 is provided between the plurality of intermediate insulating portions 71 and the plurality of insulating portions 82. In other words, in the support substrate 104, the conductive portions 81, the intermediate insulating portions 71, the intermediate conductive portions 72, and the insulating portions 82 can be aligned repetitively in this order in the X-axis direction. In other words, in the support substrate 104, two insulating portions are provided between two conductive portions, and another conductive portion is provided between these two insulating portions.

The thickness of the intermediate insulating portions 71 (thickness in the X-axis direction) is, for example, substantially the same as the thickness of the insulating portions 82. The material of the intermediate insulating portions 71 is substantially the same as the material of the insulating portions 82. For example, thermally oxidized silicon film ($SiO_2$) can be used as the intermediate insulating portions 71 and the insulating portions 82. In this case, the thickness of the intermediate insulating portions 71 and the thickness of the insulating portions 82 is, for example, not more than 1 μm. For example, a metal material with high thermal conductivity such as Cu or Al or the like can be used as the intermediate conductive portions 72.

In the support substrate 104, for example, it is possible to shorten the cycle of the insulating portions and conductive portions compared with the support substrate 80 and the like. For example, it is possible to improve electrical conductivity and thermal conductivity compared with the support substrate 80 and the like. Also, by using a thermally oxidized film in the intermediate insulating portions 71 and the insulating portions 82, it is possible to increase the insulation while reducing the thickness.

In the support substrate 104, the plurality of first metal portions 83 and the plurality of second metal portions 84 can be further provided. This is not a limitation, and the metal layers 61 to 66 may be provided on a substrate main body that includes the intermediate insulating portions 71 and the intermediate conductive portions 72, the same as for the support substrate 100. In addition, in the substrate main body that includes the intermediate insulating portions 71 and the intermediate conductive portions 72, the plurality of first metal portions 83 may be provided on the top face side, and the metal layers 64 to 66 may be provided on the bottom face side, the same as the support substrate 102.

FIGS. 7A to 7G are cross-sectional views schematically illustrating the process of manufacturing a different support substrate according to the first embodiment.

FIGS. 7A to 7G schematically illustrate an example of the process of manufacturing the support substrate 102.

Figure 7A:
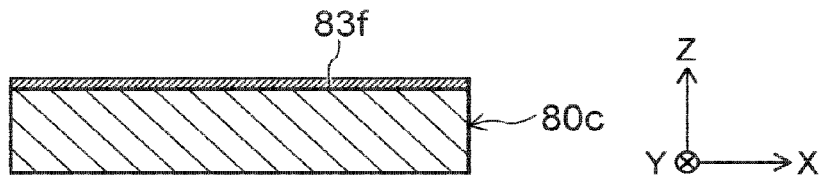
FIGS. 7A to 7G are cross-sectional views schematically illustrating the process of manufacturing a different support substrate according to the first embodiment.

As illustrated in FIG. 7A, in the manufacture of the support substrate 102, first the conductive substrate 80c that includes the material that will form the conductive portions 81 is prepared. Then, using a film forming process such as a deposition method or a sputtering method, a metal film 83f, from which each of the first metal portions 83 are formed, is formed on the conductive substrate 80c.

Figure 7B:
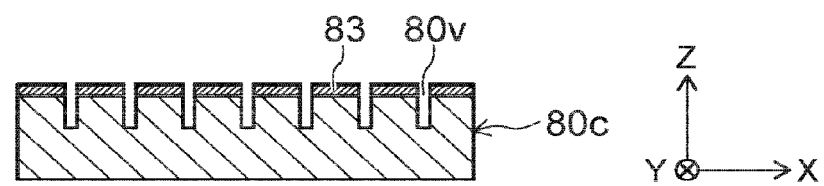

As illustrated in FIG. 7B, the plurality of grooves 80v is formed in the metal film 83f and the conductive substrate 80c by, for example, a photolithography process and an etching process. In this way, each of the first metal portions 83 are formed from the metal film 83f. The shape of each groove 80v is in accordance with the shape of each insulating portion 82.

Figure 7C:
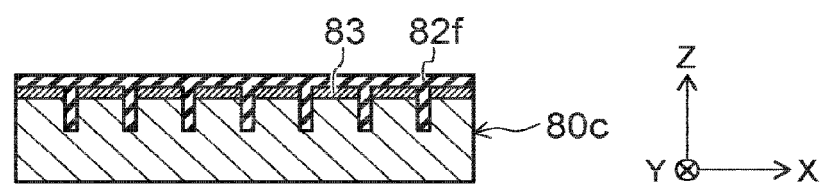

As illustrated in FIG. 7C, insulating material is applied onto each of the first metal portions 83 and the conductive substrate 80c by, for example, spin on glass (SOG), and by filling each groove 80v with the insulating material, the insulating film 82f is formed on each first metal portion 83 and the conductive substrate 80c. The material of the insulating film 82f is substantially the same as the material of each insulating portion 82.

Figure 7D:
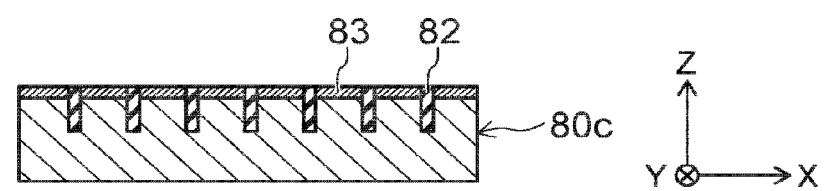

As illustrated in FIG. 7D, the insulating film 82f is ground by, for example, a grinding process. In this way, each of the insulating portions 82 is formed from the insulating film 82f. Then, a separately formed stacked body SB or the like is stacked on each insulating portion 82 and each first metal portion 83.

Figure 7E:
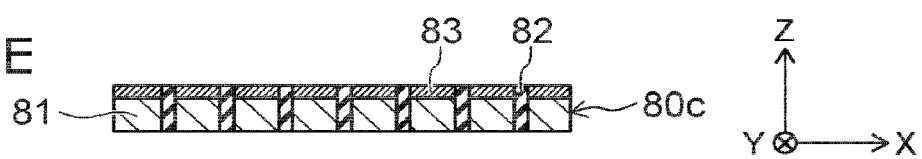

As illustrated in FIG. 7E, after bonding the stacked body SB or the like, the conductive substrate 80*c* is ground from the reverse face side, and the ends of each insulating portion 82 are exposed. In this way, the conductive substrate 80*c* is divided by each of the insulating portions 82, and each of the conductive portions 81 are formed from the conductive substrate 80*c*. Grinding from the reverse face side may be carried out, for example, before bonding the stacked body SB or the like.

Figure 7F:
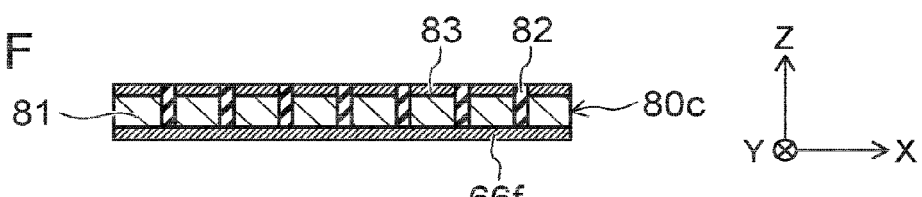

As illustrated in FIG. 7F, a metal film 66*f* that will form each of the metal layers 64 to 66 is formed on the face on the opposite side to each of the conductive portions 81 and each of the first metal portions 83 of each of the insulating portions 82, by a film forming process such as a deposition method, a sputtering method, or the like.

Figure 7G:
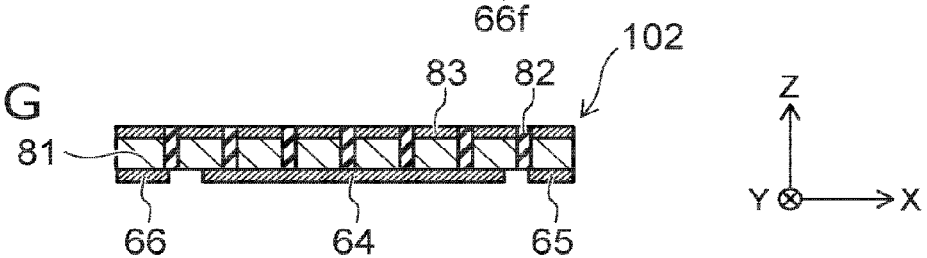

As illustrated in FIG. 7G, each of the metal layers 64 to 66 are formed from the metal film 66*f*, by film forming processes such as, for example, a photolithography process and an etching process, or the like.

As a result of the above the support substrate 102 is completed.

FIGS. 8A to 8F are cross-sectional views schematically illustrating the process of manufacturing a different support substrate according to the first embodiment.

FIGS. 8A to 8F schematically illustrate an example of the process of manufacturing the support substrate 104.

As illustrated in FIG. 8A, in the manufacture of the support substrate 104, first the conductive substrate 80*c* that includes the material that will form the conductive portions 81 is prepared. Then, the plurality of grooves 80*v* is formed in the conductive substrate 80*c* by, for example, a photolithography process and an etching process. The shape of the grooves 80*v* may be, for example, the shape used in the dicing process.

As illustrated in FIG. 8B, the plurality of insulating films 82*f* that will form each of the insulating portions 82 and each of the intermediate insulating portions 71 is formed on the inner face of each groove 80*v*, by a thermal oxidizing process, for example. Each insulating film 82*f* is, for example, a thermally oxidized film.

As illustrated in FIG. 8C, each intermediate conductive portion 72 is formed by filling the remaining space of each groove 80*v* (the space on the inside of the insulating film 82*f*) with conductive material, by, for example, a plating process or the like.

As illustrated in FIG. 8D, each first metal portion 83 is formed on a portion that will constitute each conductive portion 81 of the conductive substrate 80*c*, by for example, a photolithography process, an etching process, and a film forming process, or the like. Then, a separately formed stacked body SB or the like is bonded on each first metal portion 83.

As illustrated in FIG. 8E, after bonding the stacked body SB or the like, the conductive substrate 80*c* and each insulating film 82*f* are ground from the reverse face side, and the ends of each intermediate conductive portion 72 are exposed. In this way, each intermediate insulating portion 71 and each insulating portion 82 is formed from each insulating film 82*f*. At the same time, the conductive substrate 80*c* is divided, and each conductive portion 81 is formed from the conductive substrate 80*c*. Grinding from the reverse face side may be carried out, for example, before bonding the stacked body SB or the like.

As illustrated in FIG. 8F, each second metal portion 84 is formed on the bottom of each conductive portion 81, by, for example, a photolithography process, an etching process, and a film making process, or the like.

As a result of the above the support substrate 104 is completed.

Second Embodiment

Figure 9:
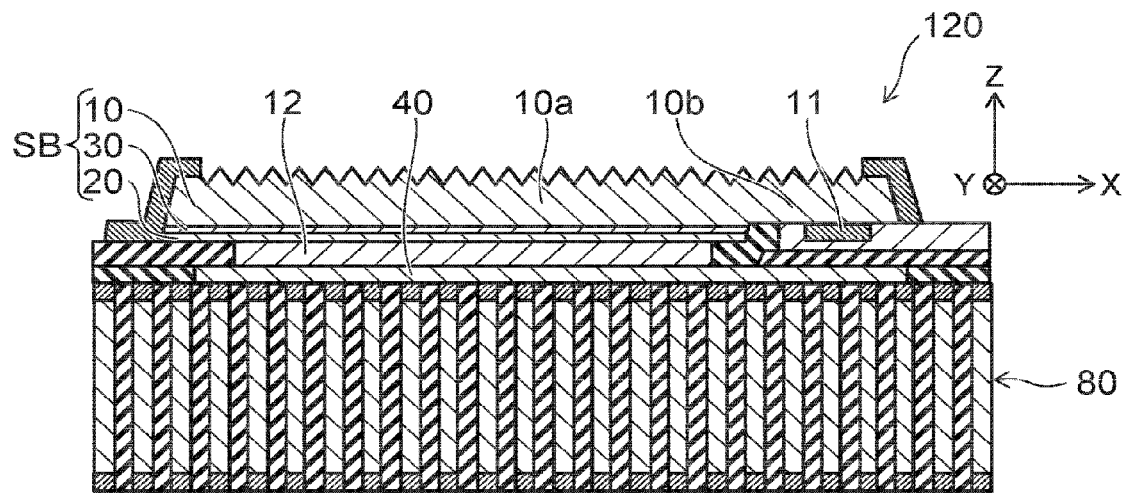
FIG. 9 is a schematic cross-sectional view illustrating a semiconductor light emitting element according to a second embodiment.

FIG. 9 is a schematic cross-sectional view illustrating a semiconductor light emitting element according to a second embodiment.

As illustrated in FIG. 9, a semiconductor light emitting element 120 includes the first semiconductor layer 10, a first portion 10*a*, and a second portion 10*b*. The second portion 10*b* is aligned with the first portion 10*a* in the X-axis direction. In this example, the second semiconductor layer 20 is provided between the first portion 10*a* and the top face 80*u*. Also, the first electrode 11 is provided between the second portion 10*b* and the top face 80*u*. The first electrode 11 is electrically connected to the first semiconductor layer 10 by, for example, contact with the second portion 10*b*.

In the semiconductor light emitting element 120 also, at least one insulating portion 82 is disposed between the side face 80*sa* and the portion of the metal layer 40 closest to the side face 80*sa*, when projected onto a plane parallel with the top face 80*u* (the X-Y plane). The second electrode 12 is electrically insulated from the side face 80*sa* by at least one insulating portion 82 disposed between at least one conductive portion 81 that is electrically connected to the second electrode 12 and the side face 80*sa* of the support substrate 80. Therefore, in the semiconductor light emitting element 120 also, it is possible to electrically connect the first electrode 11 and the first electrode pad 201 via the second conductive portion 81*b* or the first connection member 211 or the like. For example, it is not necessary to provide a pad or the like for connecting bonding wire, for connecting electrically to the first semiconductor layer 10. Therefore, in the semiconductor light emitting element 120, it is possible to obtain a high light extraction efficiency.

Figure 10:
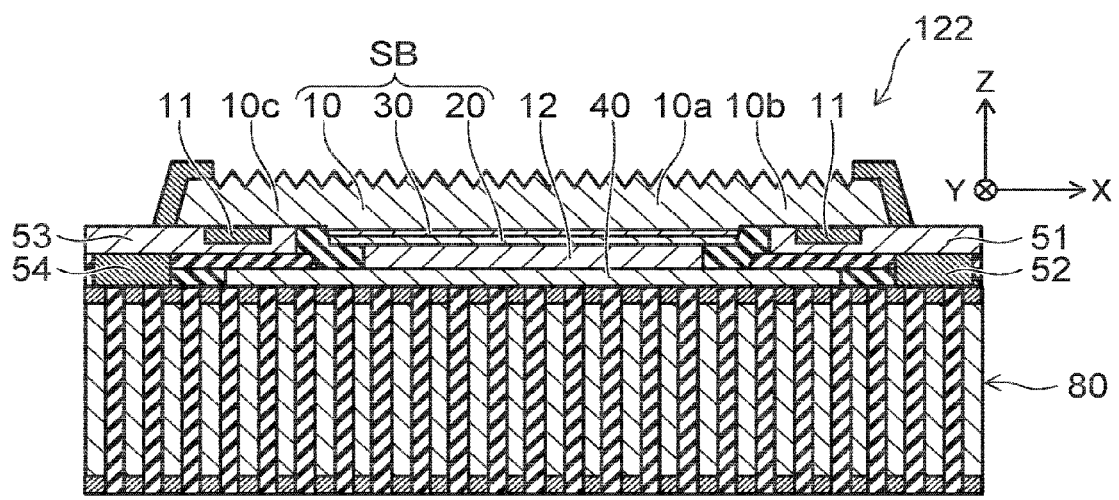
FIG. 10 is a schematic cross-sectional view illustrating another semiconductor light emitting element according to the second embodiment.

FIG. 10 is a schematic cross-sectional view illustrating another semiconductor light emitting element according to the second embodiment.

As illustrated in FIG. 10, a semiconductor light emitting element 122 includes a plurality of first electrodes 11. In this example, the semiconductor light emitting element 122 includes two first electrodes 11. The number of first electrodes 11, for example, may be three or more.

The first semiconductor layer 10 of the semiconductor light emitting element 122 further includes a third portion 10*c*. The third portion 10*c* is, for example, aligned with the first portion 10*a* and the second portion 10*b* in the X-axis direction. In this example, the first portion 10*a* is disposed between the second portion 10*b* and the third portion 10*c*.

In the semiconductor light emitting element 122, one of the two first electrodes 11 is provided between the second portion 10*b* and the top face 80*u*. The other first electrode 11 is provided between the third portion 10*c* and the top face 80*u*. The two first electrodes 11 are separated from each other.

One of the first electrodes 11 is electrically connected to at least one of the conductive portion 81 that is not electrically connected to the second electrode 12, via, for example, a metal layer 51 and a via 52. The other of the first electrodes 11 is electrically connected to at least one of the conductive portions 81 that is not electrically connected to the second electrode 12 and the other first electrode 11, via, for example, a metal layer 53 and a via 54.

In this way, in the semiconductor light emitting element 122, one of the first electrodes 11 is electrically connected to at least one of the conductive portions 81, and the other first electrode 11 is electrically connected to at least one different conductive portion 81. In other words, in the semiconductor light emitting element 122, the first electrodes 11 are not connected to each other. Each of the first electrodes 11 are, for example, electrically connected to each other in the mounting substrate 200. In this way, a plurality of first electrodes 11 may be provided separated from each other, and each of the first electrodes 11 may be electrically connected to each other outside the semiconductor light emitting element 122.

According to these embodiments, a semiconductor light emitting element and light emitting device that are capable of increasing the light extraction efficiency can be provided.

Note that in this specification, the term, "nitride semiconductor" includes semiconductors of all compositions wherein composition proportions of x, y, and z in the formula $B_xIn_yAl_zGa_{1-x-y-z}N$ fall within the respective ranges of $0 \le x \le 1$, $0 \le y \le 1$, $0 \le z \le 1$, and $x+y+z \le 1$. Furthermore, with the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like. In the Specification of this Application, the form "(something) is provided on" includes the state in which other elements are inserted between, in addition to the state in which (something) is in direct contact. The form "(something) is stacked" includes the state in which other elements are inserted between, in addition to the state in which (something) is stacked in direct contact. The form "(something) is opposite to" includes the state in which other elements are inserted between, in addition to the state in which (something) directly faces (something else). In the Specification of this Application, the form "electrically connected" includes the case in which elements are connected via another conductive member or the like, in addition to being connected by direct contact.

Embodiments of the invention with reference to examples were described above. However, the embodiments of the invention are not limited to these examples. For example, if a person with ordinary skill in the art to which this invention pertains selects as appropriate the configuration of each of the elements included in the semiconductor light emitting element and light emitting device, such as the support substrate, the conductive portion, the insulating portion, the stacked body, the first semiconductor layer, the second semiconductor layer, the light emitting layer, the first electrode, the second electrode, the first alternating portion, the second alternating portion, the intermediate portion, the intermediate conductive portion, the mounting substrate, the first electrode pad, the second electrode pad, the first connection member, and the second connection member from the commonly known range and implements this invention in the same way, it will be included within the scope of this invention provided the same effect can be obtained.

Additionally, combinations of elements from two or more of the examples are also included in the scope of the invention, provided that they are technically possible and do not depart from the spirit of the invention.

Beside such cases, all semiconductor light emitting elements and light emitting devices based on the embodiments of the invention described above that are obtainable through appropriate design modifications by a person skilled in the art shall be understood to fall within the scope of the invention, provided such semiconductor light emitting elements and light emitting devices do not depart from the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
a first substrate having a first face and a first side face, the first face being parallel to a first direction and a second direction perpendicular to the first direction, the first side face intersecting the first direction and extending in the second direction, the first substrate including a plurality of conductive portions and a plurality of insulating portions arranged alternately in the first direction over the first face, each of the conductive portions and each of the insulating portions extending in the second direction and also extending in a third direction perpendicular to the first face;
a stacked body aligned with the first substrate in the third direction intersecting with the first direction and the second direction, the stacked body including a first semiconductor layer and a second semiconductor layer and a light emitting layer, the first semiconductor layer having a second side face intersecting the first direction, the first semiconductor layer being of a first conductivity type, the second semiconductor layer being provided between the first semiconductor layer and the first face, the second semiconductor layer being of a second conductivity type, the light emitting layer being provided between the first semiconductor layer and the second semiconductor layer;
an electrode electrically connected to the first semiconductor layer, the electrode covering at least a portion of the second side face; and
a conductive layer provided between the second semiconductor layer and the first substrate, the conductive layer being electrically connected to at least one of the conductive portions and the second semiconductor layer,
at least one of the insulating portions being disposed between the first side face and a portion of the conductive layer nearest to the first side face,
wherein the first face includes a first region electrically connected to the first semiconductor layer, and a second region electrically connected to the second semiconductor layer, and a distance between centers of each of the insulating portions in the first direction is not more than a distance between the first region and the second region in the first direction.

2. The element according to claim 1, wherein the conductive layer is electrically insulated from the first side face by the at least one of the insulating portions.

3. The element according to claim 1, wherein a width of each of the insulating portions in the first direction is not less than 1 µm and not more than 10 µm, and a distance between centers of each of the insulating portions in the first direction is not less than 2 µm and not more than 30 µm.

4. The element according to claim 1, wherein the first semiconductor layer includes a second face on the opposite side to the light emitting layer, the electrode includes a first extending part and a second extending part, the first extending part covers at least a portion of the second side face, the second extending part covers a portion of the second face, the second extending part extends in an extension direction parallel to the first face, and a width of the second extending part in a direction perpendicular to the extension direction is not more than 20 µm.

5. The element according to claim 4, wherein an area of the second extending part is not less than 1% and not more than 30% of an area of the second face.

6. The element according to claim 1, wherein a width of the first semiconductor layer in the first direction reduces in a direction from the first substrate towards the stacked body.

7. The element according to claim 1, wherein the first substrate includes: a plurality of first metal portions each provided at one end of each of the conductive portions in the third direction; and a plurality of second metal portions each provided at the other end of each of the conductive portions in the third direction.

8. The element according to claim 7, wherein an electrical conductivity of each of the first metal portions is higher than an electrical conductivity of each of the conductive portions, and an electrical conductivity of each of the second metal portions is higher than the electrical conductivity of each of the conductive portions.

* * * * *